United States Patent
Huang

(10) Patent No.: US 6,265,267 B1
(45) Date of Patent: Jul. 24, 2001

(54) FABRICATING METHOD FOR A SEMICONDUCTOR DEVICE COMPRISING GATE OXIDE LAYERS OF VARIOUS THICKNESSES

(75) Inventor: Chih-Jen Huang, Hsinchu (TW)

(73) Assignee: United Microelectronics Corp., Hsinchu (TW)

( * ) Notice: Subject to any disclaimer, the term of this patent is extended or adjusted under 35 U.S.C. 154(b) by 0 days.

(21) Appl. No.: 09/434,033

(22) Filed: Nov. 4, 1999

(51) Int. Cl.⁷ .................................................. H01L 21/8247
(52) U.S. Cl. .......................... 438/258; 438/770; 438/981
(58) Field of Search ................................... 438/257–267, 438/981, 770

(56) References Cited

U.S. PATENT DOCUMENTS

| | | | |
|---|---|---|---|
| 5,104,819 | * 4/1992 | Friberger et al. | |
| 5,665,620 | * 9/1997 | Nguyen et al. | 438/593 |
| 6,133,093 | * 10/2000 | Prinz et al. | 438/257 |
| 6,162,683 | * 12/2000 | Chen | 438/258 |
| 6,180,539 | * 1/2001 | Tung | 438/770 |

OTHER PUBLICATIONS

Wolf et al., "Silicon Processing for the VLSI Era vol. 1: Process Technology", pp. 213–215, Lattice Press, 1986.*

* cited by examiner

Primary Examiner—Richard Booth
(74) Attorney, Agent, or Firm—Thomas, Kayden, Horstemeyer & Risley, LLP

(57) ABSTRACT

A method of fabricating a semiconductor device with various thicknesses of the gate oxide layers is described, which method is applicable to a substrate having a first region and a second region, wherein the first region has a first conductive layer to isolate the first gate oxide layer from the substrate. Thereafter, a first oxide layer/nitride layer is formed on the first conductive layer, followed by forming a doped polysilicon layer on the first oxide layer/nitride layer, wherein the doped polysilicon layer is not formed in the second region. Subsequently, a second gate oxide layer is formed on the substrate of the second region, whereas a first oxide layer/nitride layer/second oxide layer is concurrently converted from the oxide layer/nitride layer/doped polysilicon layer. A defined second conductive layer is then formed on the first oxide layer/nitride layer/second oxide layer and the second gate oxide layer.

6 Claims, 6 Drawing Sheets

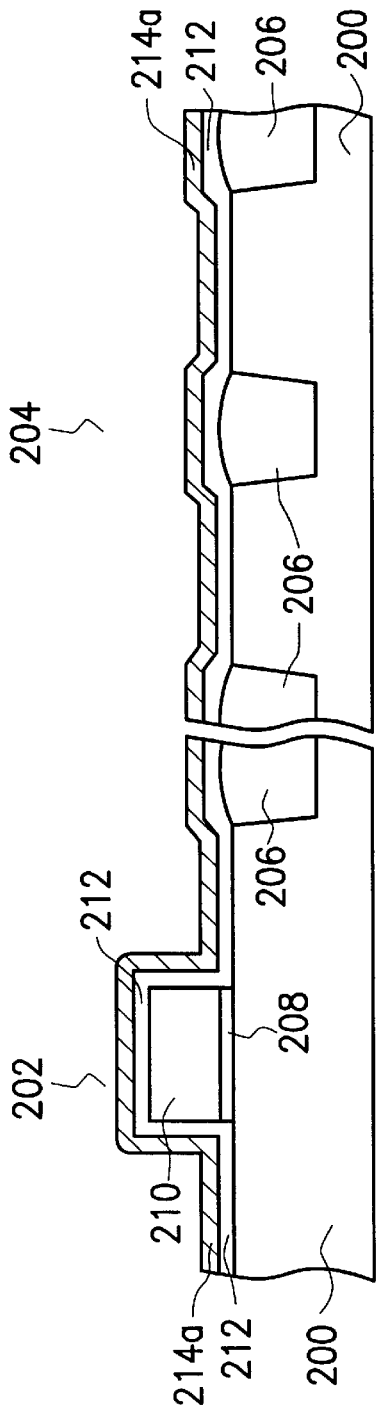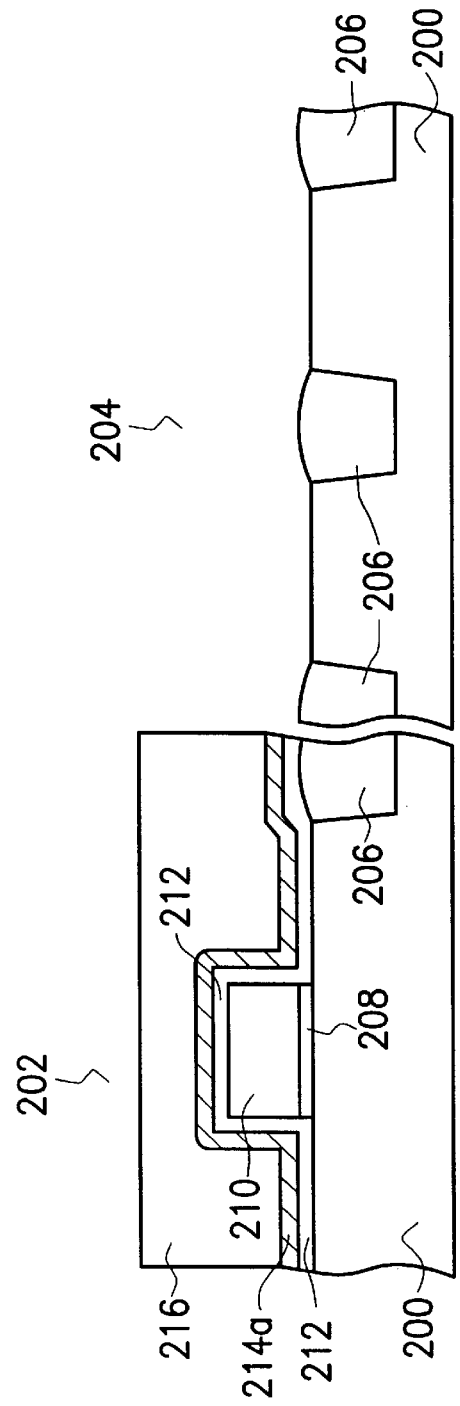
FIG. 2A
FIG. 2B

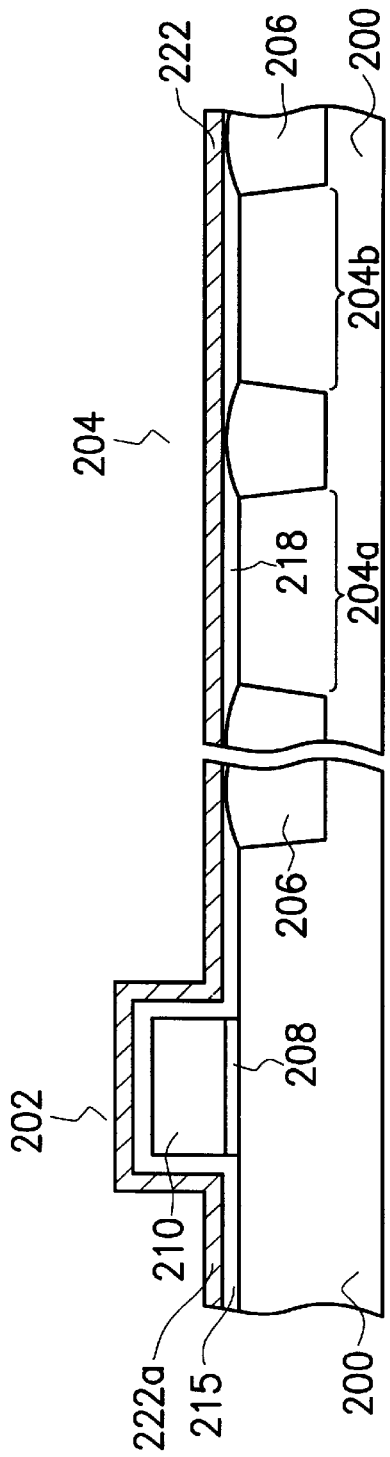
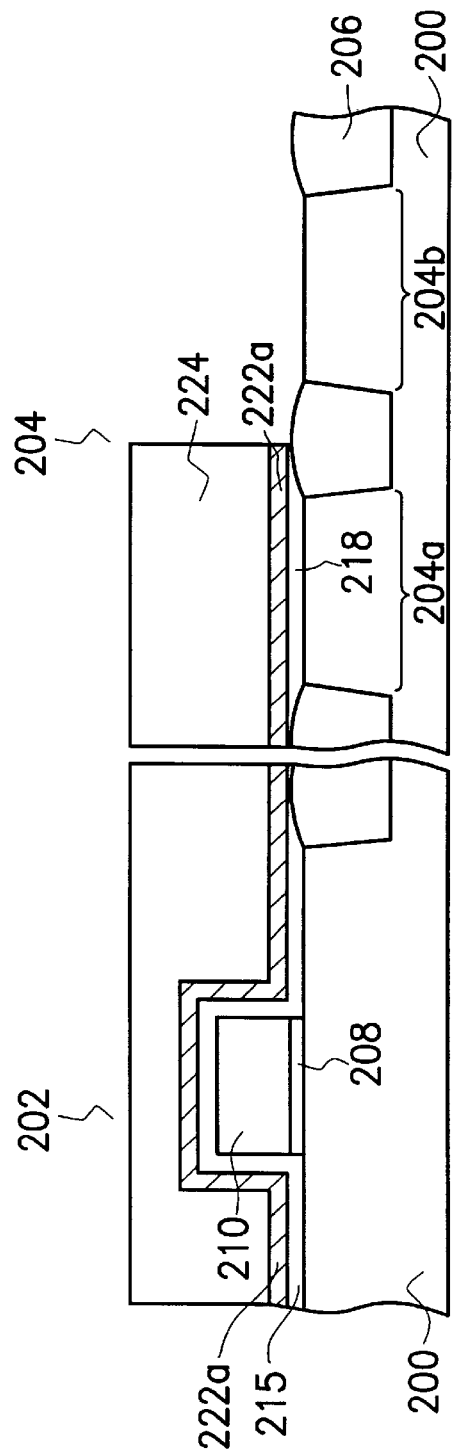
FIG. 3A
FIG. 3B

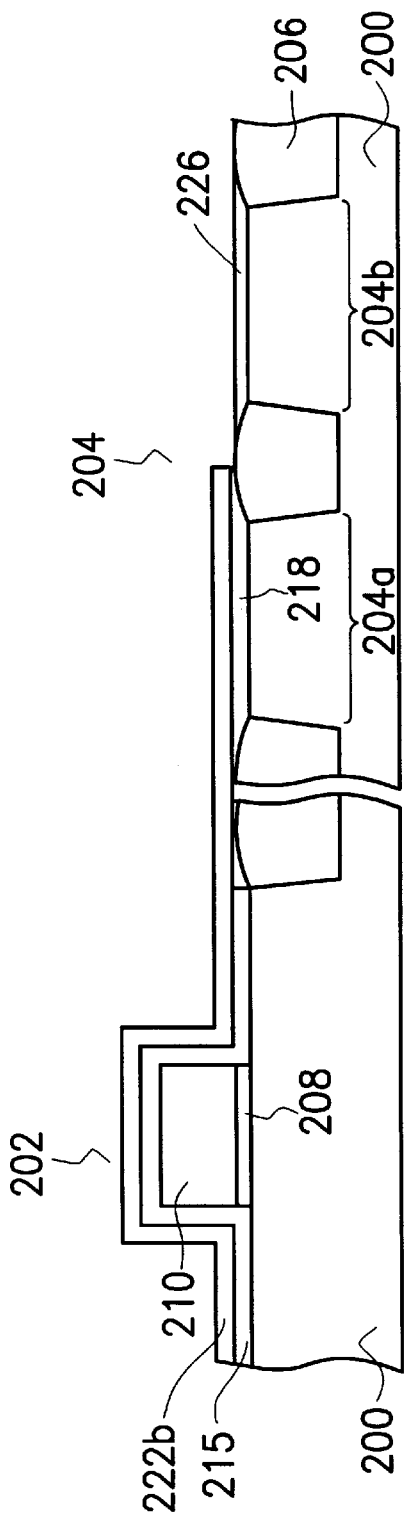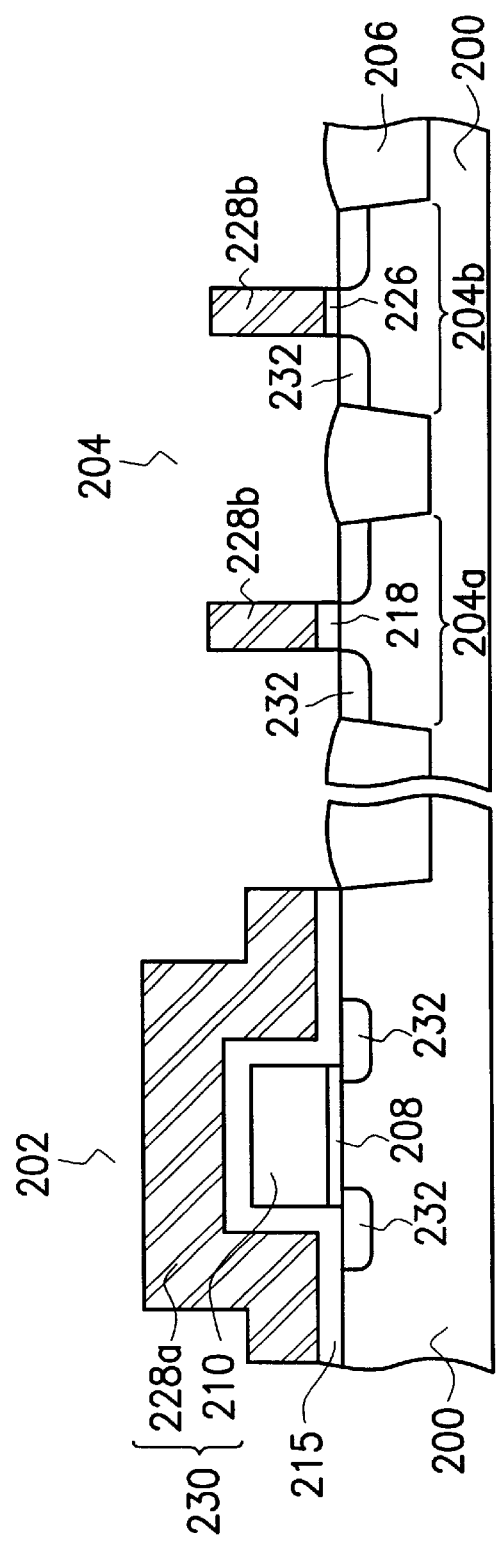

US 6,265,267 B1

FABRICATING METHOD FOR A SEMICONDUCTOR DEVICE COMPRISING GATE OXIDE LAYERS OF VARIOUS THICKNESSES

BACKGROUND OF THE INVENTION

1. Field of the Invention

The present invention relates to a fabrication method for a semiconductor device comprising gate oxide layers of various thicknesses. More particularly, the present invention relates to a fabrication method for a flash memory cell comprising gate oxide layers of various thicknesses.

2. Description of the Related Art

To lower manufacturing cost and to simplify the manufacturing procedures for a semiconductor device, integrating different devices, such as the memory cell and the logic circuit on the same wafer has become a trend in the semiconductor industry. Examples of such are the embedded dynamic random access memory (DRAM) in which a dynamic random access memory cell and a logic circuit device are constructed on the same wafer and the embedded flash memory cell in which a flash memory cell and a logic circuit device are integrated on the same wafer.

In order for the memory cell device to be reliable, the logic circuit device to have high performance and to have different voltages applied to the device, it is necessary to manufacture gate oxide layers with various thicknesses during the fabrication of a wafer with integrated devices such as the memory cell and the logic circuit region, which is essential for accommodating the demands of the device operations.

FIGS. 1A to 1D are schematic, cross-sectional views showing the manufacturing of an embedded flash memory cell. As shown in FIG. 1A, a substrate 100 comprises a memory cell region 102 and a logic circuit region 104, wherein between the memory cell region 102 and the logic circuit region 104, and between devices are isolated by isolation structures 106. The memory cell region 102 comprises a floating gate 108, wherein insulation between the floating gate 108 and the substrate 100 is provided by a gate oxide layer 110. An oxide/nitride/oxide (ONO) layer 112 is then formed on the memory cell region 102 and the logic circuit region 104. The ONO layer 112 formed on the floating gate 108 serves as a dielectric layer between the flash memory floating gate 108 and the control gate formed subsequently.

Thereafter, a photoresist 114 is formed on the ONO layer 112. Using the photoresist 114 to define the ONO layer 112, the ONO layer 112 in the logic circuit region 104 is removed, exposing the substrate 100 as illustrated in FIG. 1B. Continuing to FIG. 1C, the photoresist 114 is removed. A gate oxide layer 116 is then formed on the exposed substrate 100 in the logic circuit region 104 (as in FIG. B).

Still referring to FIG. 1C, the same procedures are being conducted in which a photoresist 122 is used to cover the memory cell region 102 and a portion of the logic circuit region 104. The portion of the gate oxide layer 116 not covered by the photoresist 122 is removed, exposing the substrate 100. A gate oxide layer 116' of a different thickness is then formed on the exposed substrate 100, followed by removing the photoresist 122.

Referring to FIG. 1D, a control gate 118a is further formed on the ONO layer 112, and gates 118b, 118c are formed on the gate oxide layers 116, 116' respectively. Source/drain regions are then formed on both sides of each gate.

Although in the above manufacturing process, gate oxide layers 110, 116, 116' of various thicknesses are formed to accommodate the operating demands of the device, the photoresists 114, 122 are in a direct contact with the ONO layer 112 during the defining processes. The gate oxide layer 116, which also undergoes a photolithography procedure, is in direct contact with the photoresist 122. Contamination from photoresists 114, 122, which are generally formed with an organic material, easily diffuse into the ONO layer 112 and the gate oxide layer 116 when the photoresists are placed in a direct contact with the ONO layer 112 or the gate oxide layer 116. Furthermore, the removal of the photoresists 116, 112, for example by plasma, easily induces damages in the underlying materials. With the high demand for the reliability of the ONO layer 112 and the gate oxide layer 116, the problems of contamination and potential damages induced by the photoresist mentioned above lower the reliability of the ONO layer and seriously affect the device operating efficiency.

SUMMARY OF THE INVENTION

Based on the foregoing, the current invention provides a fabrication method for a semiconductor device comprising various thicknesses of gate oxide layers. The method is applicable to a substrate, wherein the substrate comprises a first region and a second region. The first region further comprises a first conductive layer, isolated from the substrate by a first gate oxide layer. Thereafter, a first oxide layer/nitride layer is formed on the first conductive layer. A doped polysilicon layer is then formed on the first oxide/nitride layer of the first region, wherein the doped polysilicon layer is not formed in the second region. Subsequently, a second gate oxide layer is formed on the substrate of the second region. Concurrently, a first oxide layer/nitride layer/second oxide layer is formed from the first oxide layer/nitride layer/doped polysilicon layer. After this, a defined second conductive layer is formed on the first oxide layer/nitride layer/ second oxide layer and on the second conductive layer.

The present invention further provides a fabrication method for an embedded flash memory cell, which is applicable to a substrate comprising a memory cell region, a first logic circuit region and a second logic circuit region. A floating gate is then formed on the memory cell region, wherein the floating gate is isolated from the substrate by a gate oxide layer. A first oxide layer/nitride layer is then formed on the floating gate. After this, a doped polysilicon layer is formed on the memory cell, not covering but rather exposing the first logic circuit region or the second logic circuit region. Subsequently, the first doped polysilicon layer is converted to a first dioxide layer. A second gate oxide layer is also formed in the first and the second logic circuit regions, and the first oxide layer/nitride layer/second oxide layer in the memory cell region forms one of the inner dielectric layer for the flash memory cell. A second doped polysilicon layer is then formed on the substrate, followed by removing the second doped polysilicon layer and the second gate oxide layer in the second logic circuit region, and thus exposing the substrate in the second logic circuit region. Thereafter, a third gate oxide layer is formed on the exposed substrate in the second logic circuit region, followed by forming a defined conductive layer on the substrate in which a control gate is formed in the memory cell region. A first gate and a second gate are also formed in the first logic circuit region and the second logic circuit region, respectively.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

FIGS. 2A to 2D are schematic, cross-sectional views showing the manufacturing of an embedded flash memory cell according to the present invention;

FIGS. 3A to 3D are schematic, cross-sectional views showing the manufacturing of an embedded flash memory cell according to the present invention.

DESCRIPTION OF THE PREFERRED EMBODIMENT

To accommodate the demand of scaling devices to smaller geometries, the present invention provides a fabrication of a wafer comprising oxide layers of various thicknesses. A doped polysilicon layer is formed to cover a substrate which comprises a first oxide layer. A photoresist is then used to define the doped polysilicon layer and the first oxide layer, and the doped polysilicon layer and the first oxide layer in the first region, which are not covered by the photoresist, are removed. The photoresist is further removed, followed by conducting a thermal process on the exposed substrate surface to form a second oxide layer on the substrate surface in the first region. Concurrently, the doped polysilicon layer is oxidized to form a poly-oxide layer. Since the structure of the poly-oxide layer is more loosely packed than the thermally oxidized layers, the poly-oxide layer can be removed subsequently by a selective etching, for example, a wet etching, wherein the first oxide layer and the second oxide layer are not removed. The thickness of the first oxide layer is increased after undergoing the thermal process. As a result, a second oxide layer with a greater thickness than the first oxide layer is provided. Since the photoresist in the present process is coated on the doped polysilicon layer, the photoresist is not in direct contact with either the first oxide layer or the second oxide layer. Contamination of the first oxide and the second oxide layers is thus prevented.

Figure 1A:
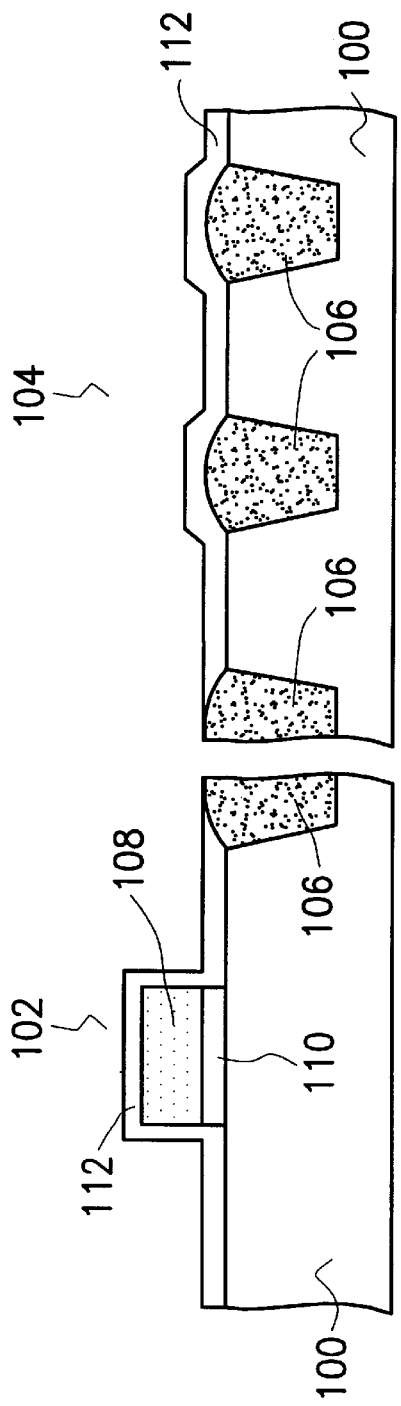
FIGS. 1A to 1D are schematic, cross-sectional views showing the manufacturing of an embedded flash memory cell according to the prior art.
Figure 1B:
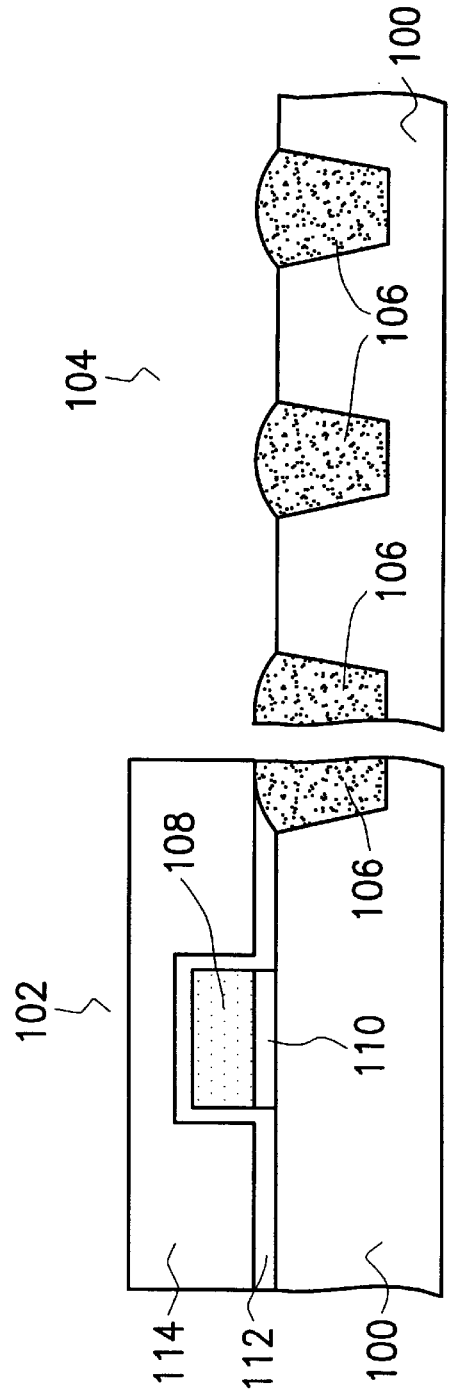
Figure 1C:
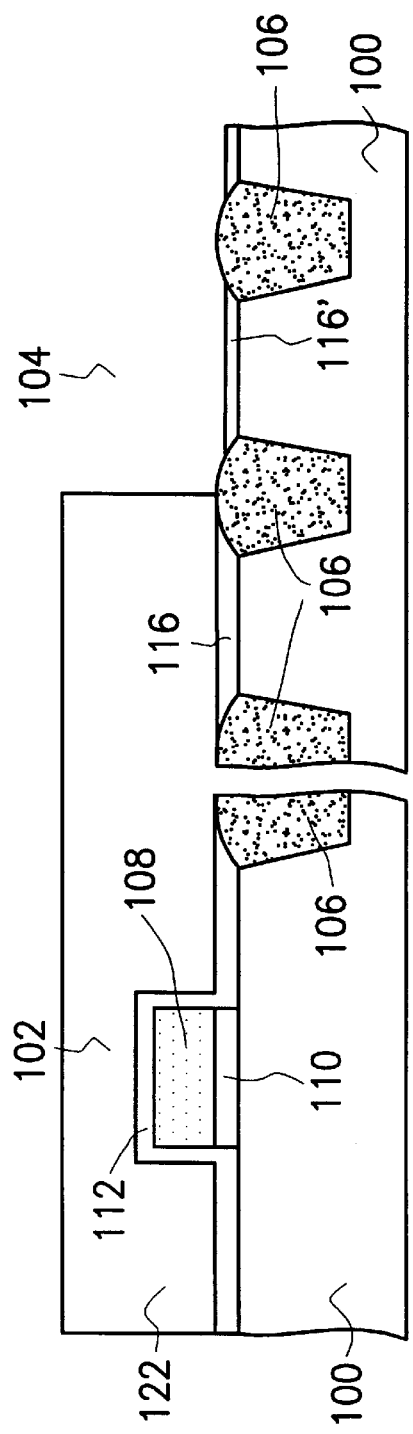
Figure 1D:
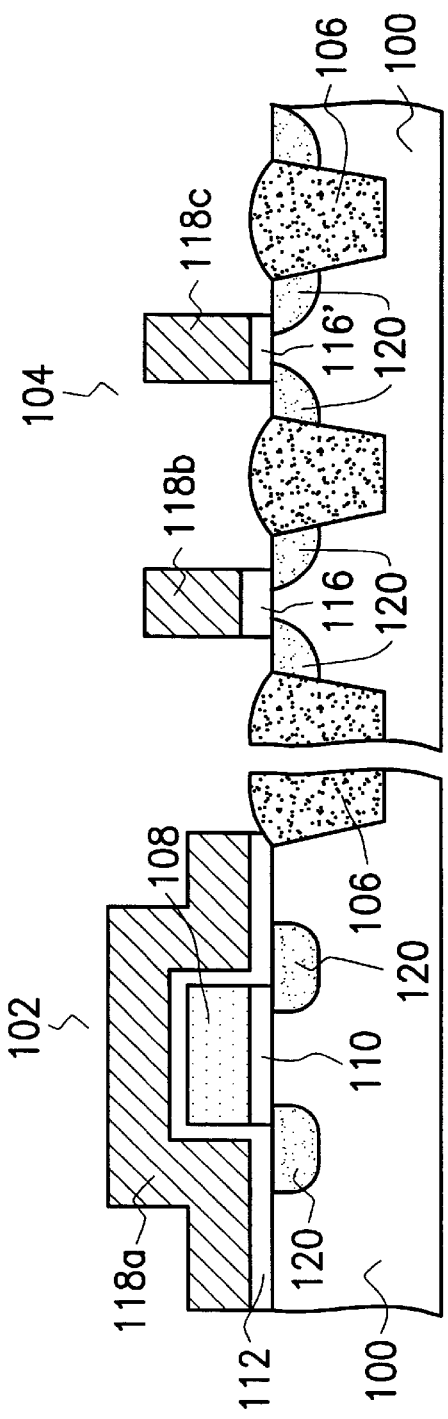
Figure 2C:
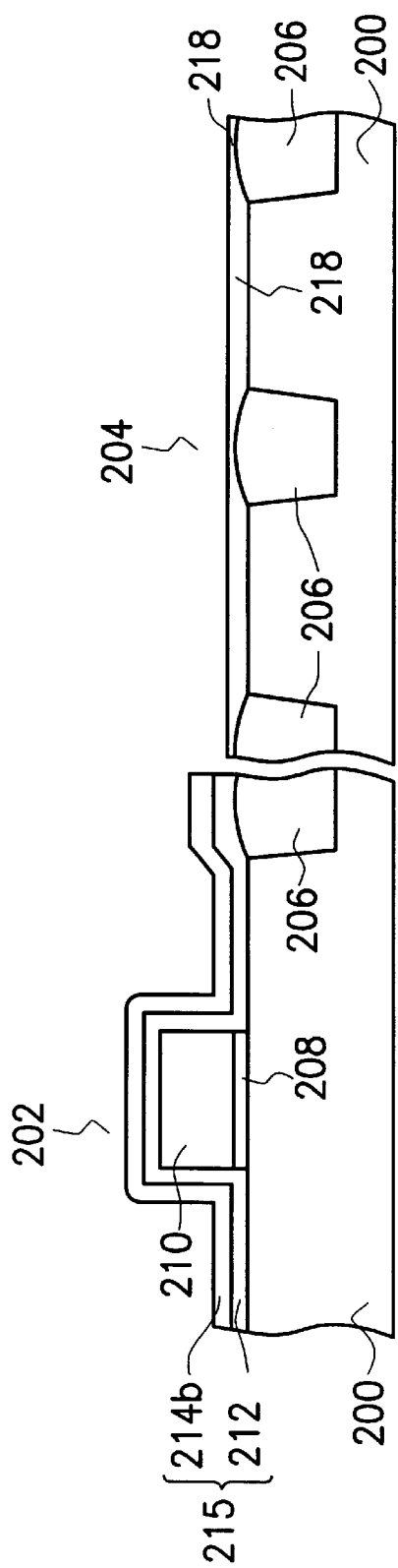
Figure 2D:
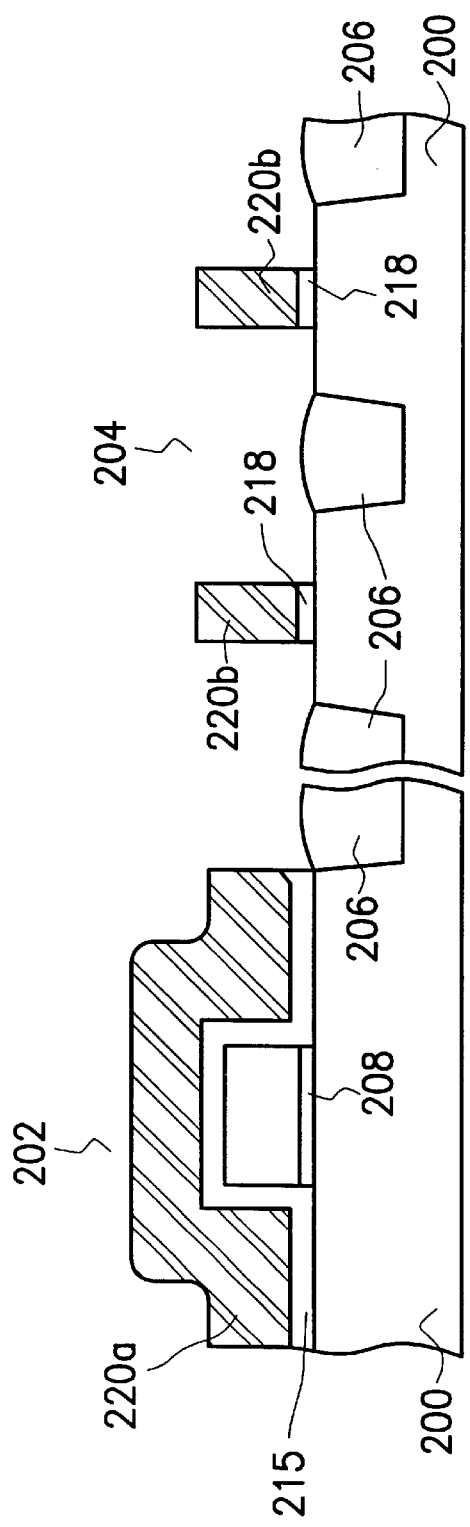

FIGS. 2A to 2D are schematic, cross-sectional views showing the manufacturing of an embedded flash memory cell according to the present invention. Referring to FIG. 2A, a substrate 200 comprises a memory cell region 202 and a logic circuit region 204, wherein isolation between the memory cell region 202 and the logic circuit region 204, and between other devices, is provided by isolation structures 206. The isolation structures 206 are, for example, field oxide layers or shallow trench isolation structures (STI). A gate oxide layer and a conductive layer are then sequentially formed in the memory cell region 202, followed by definition with photolithography and etching to form the gate oxide layer 208 and the conductive layer 210 as illustrated in FIG. 2A. The gate oxide layer 208 is, for example, a thin oxide layer of about 80Å to about 100Å thick formed by thermally oxidizing the substrate 200. The gate oxide layer 208, also used as a tunnel oxide layer, is to isolate the subsequently formed flash memory cell structure and the substrate 200. The conductive layer 210 is, for example, a doped polysilicon layer, deposited by chemical vapor deposition (CVD), followed by photolithography and etching to define a pattern for a floating gate of the flash memory cell.

Still referring to FIG. 2A, an oxide layer/nitride layer 212 is formed in the logic circuit region 204 and the memory cell region 202, wherein the oxide layer/nitride layer 212 formed on the conductive layer 210 becomes a portion of the dielectric layer of the flash memory structure. A doped polysilicon layer 214a is then formed on the oxide layer/nitride layer 212, by, for example, depositing impurity in-situ via chemical vapor deposition, wherein the dopant concentration is about $1 \cdot 10^{19}/cm^3$ and the thickness of the doped polysilicon layer 214a is below about 150Å.

Thereafter, a photoresist 216 is formed on the doped polysilicon layer 214a to define the doped polysilicon layer 214a and the oxide layer/nitride layer 212 by means of photolithography and etching. The doped polysilicon layer 214a and the oxide layer/nitride layer 212 in the logic circuit region 204 are removed, exposing the substrate 200 in the logic circuit region 204, leaving only the doped polysilicon layer 214a and the oxide layer/nitride layer 212 in the memory cell region 202 covering the conductive layer 210 as illustrated in FIG. 2B. The photoresist layer 216 is then removed to expose the doped polysilicon layer 214a.

Referring to FIG. 2C, a thermal process is conducted, by, for example, placing the structure in a furnace in an oxygen-filled environment or performing a rapid thermal process (RTO), to oxidize the doped polysilicon layer 214a (as in FIG. 2B) on the oxide layer/nitride layer 212 to an oxide layer 214b. Concurrently, the exposed silicon substrate 200 in the logic circuit region 204 is also being oxidized to form a gate oxide layer 218, covering the substrate 200 in the logic circuit region 204.

In order to convert the doped polysilicon layer 214a completely to an oxide layer 214b, ions are doped in-situ. The concentration of the doped ions must be sufficient to completely convert the doped polysilicon layer 214a to an oxide layer 214b. The doped ions also increase the oxidation rate of the doped polysilicon layer 214a. As a result, the oxide layer/nitride layer 212 and the oxide layer 214b together form an oxide/nitride/oxide (O/N/O) layer 215 as the dielectric layer between flash memory control gate and the floating gate. Since the oxide layer 214b is being oxidized from the doped polysilicon layer 214a (as in FIG. 2B) to become a part of the O/N/O layer 215, the doped polysilicon layer 214a can not be too thick and must be controlled to be within the required range of thickness for the oxide layer 214b.

In addition, the gate oxide layer 218 in the logic circuit region 204 is generated by consuming the silicon substrate 200 during the oxidation of the doped polysilicon layer 214a (as in FIG. 2B). The thickness of the gate oxide layer 218 can also be controlled by the duration of the thermal process. For a device formed subsequently that requires a thicker layer of the gate oxide layer 218, the duration of the thermal process can be extended to form a thicker gate oxide layer 218.

After the formation of the ONO layer 215 on the floating gate 210 and the gate oxide layer 218 in the logic circuit region 204, a defined conductive layer, for example, a doped polysilicon layer, is then formed on the ONO layer 215 and the gate oxide layer 218 to form a control gate 220a in the memory cell region 202 and a gate 220b in the logic circuit region 204. Since the photoresist in the above process is not directly covering the ONO layer 215 or the gate oxide layer 218, contamination of the ONO layer 215 or the gate oxide layer 218 by the photoresist is prevented. In addition, gate oxide layers with the various thicknesses can be formed on the same substrate 200, such as the gate oxide layer 208 in the memory cell region 202 and the gate oxide layer 218 in the logic circuit region 204.

Using the doped polysilicon layer 214a formed in the above process to cover the memory cell region 202, the photoresist 202 is isolated from having a direct contact with the oxide layer/nitride layer 212. In addition, the oxidation of the doped polysilicon layer 214a concurrently allows the formation of the gate oxide layer 220b on the substrate in the logic circuit region 204. Furthermore, more than two types of the gate oxide layer 220b of various thicknesses can be formed in the subsequent process according to the device requirements.

The procedures illustrated in FIGS. 3A to 3D are continuations of the procedures illustrated in FIG. 2C. Since the preceding procedures are similar to those shown in FIGS. 2A to 2C, they will not be reiterated here. Referring to FIG. 3A, the logic circuit region 204 is further divided into a first logic circuit region 204a and a second logic circuit region 204b to accommodate devices of different properties formed in the subsequent process, such as a high voltage device and a low voltage device. A doped polysilicon layer 222a is then formed on the ONO layer 215 and the gate oxide layer 218, for example, impurities are doped in-situ by means of chemical vapor deposition.

Thereafter, as shown in FIG. 3B, a photoresist is then coated on the doped polysilicon layer 222, covering the memory cell region 202 and the first logic circuit region 204a. After photolithography and etching, the doped polysilicon layer 222a and the gate oxide layer 218 in the second logic circuit region 204b are removed, exposing the substrate 200 in the second logic circuit region 204b. The photoresist 224 is further removed, exposing the doped polysilicon layer 222a.

Referring to FIG. 3C, a thermal process is conducted, for example, the structure is placed in a furnace in an oxygen-filled environment or a rapid thermal process (RTP) is performed, to oxidize the doped polysilicon layer 222a that covers the ONO layer 215 into a polyoxide layer 222b. Concurrently, the exposed silicon substrate 200 in the second logic circuit region 204b is oxidized to form a gate oxide layer 226, covering the substrate 200 in the second logic circuit region 204b due the thermal process mentioned above. During the thermal process, the thickness of the gate oxide layer 218 in the first logic circuit region 204a is also increased slightly. Since underlying the oxide layer 214b (as in FIG. 2C) of the ONO layer 215 is a nitride layer, the oxide layer 214b is never in a direct contact with the polysilicon material, and the thickness of the oxide layer 214b is not affected.

In order to convert the doped polysilicon layer 222a completely to a poly-oxide layer 222b, ions are being doped in-situ. The concentration of the doped ions must be sufficient to completely convert the doped polysilicon layer 222a to a poly-oxide layer 222b, and the doped ions can also increase the rate of oxidation of the doped polysilicon layer 222a.

Thereafter, the poly-oxide layer 222b in the first logic circuit region 204a and in the memory cell region 202 is removed, by, for example, wet etching, to expose the ONO layer 215 in memory cell 202 and the gate oxide layer 218 in the first logic circuit region 204a. Since the poly-oxide layer 222b formed by oxidizing the doped polysilicon layer 222a is more loosely packed than the oxide layers 226, 218 formed by means of a thermal process, an etchant with a higher etching selectivity ratio can be used to remove the poly-oxide layer 222b without removing the gate oxide layers 218, 226 formed in the thermal process. The etchant includes a dilute hydrogen fluoride (HF) or a buffer oxide etchant (BOE). By varying the ratio of the etchant, the ploy-oxide layer 222b can be completely removed without inducing damages to the gate oxide layers 218, 226. The etching ratio of the etchant for the poly-oxide layer 222b to the thermally formed oxide layers 218 and 226 needs to be greater than 3 to 1.

Although the oxide layer 214b (as in FIG. 2C) is formed by oxidizing the doped polysilicon layer 214a (as in FIG. 2B), the subsequent thermal processes including the thermal process for the formation of the gate oxide layer 226 or the thermal processes that activates impurities in the substrate 200 or in the conductive layer 210 can densify the structure of the oxide layer 214b. As a result, the oxide layer 214b employed as the inner dielectric layer of the flash memory cell will not have a quality problem. Furthermore, since the oxide layer 214b is densified during the thermal process in forming the gate oxide layer 226, the structure of the oxide layer 214b is more densely packed than the poly-oxide layer 222b. The removal of the polyoxide layer 222b is easily accomplished by selectively etching the poly-oxide layer 222b overlying the ONO layer 215 without inducing damages to the oxide layer 214b.

Continuing to FIG. 3D, a defined conductive layer 228 is then formed on the ONO layer 214 and on the gate oxide layers 218 and 222, for example, a doped polysilicon layer, as a control gate 228a for the memory cell region 202 and a gate 228b for the logic circuit region 204. Since the photoresist in the above process is not in any direct contact with the ONO layer 215 or the gate oxide layers 218, 226, contamination to the ONO layer 215 or the gate oxide layers 218, 226 by the photoresist is prevented. Furthermore, gate oxide layers of the various thicknesses can be formed on the same substrate 200. The subsequent formation of the flash memory cell 230 and the source/drain regions 232 on the sides of the gate 228 follows the conventional practice and is familiar to those who are skilled in the art.

According to the preferred embodiment of the present invention, the photoresist is prevented to have a direct contact with the inner dielectric layer or the gate oxide layer to cause contamination to the inner dielectric layer or the gate oxide layer. The dielectric layer or the gate oxide layer is also prevented from being damaged during the removal of the photoresist, thereby increasing the reliability of the dielectric layer and the gate oxide layer.

In addition, the manufacturing of the memory cell region and logic circuit region are integrated on the same wafer, and the gate oxide layers with the various thickness are formed to accommodate the demand of a high voltage device operation and a low voltage device operation.

Although in the preferred embodiment, the present invention has been described with respect to an embedded flash memory cell, the invention is also applicable to a flash memory cell or other semiconductor devices with the gate oxide layers of various thicknesses.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A fabrication method for a semiconductor device comprising various thicknesses of oxide layers, which is applicable to a substrate comprising a first region and a second region, the method comprising the steps of:

forming a first oxide layer on the substrate;

forming a doped polysilicon layer on the first oxide layer;

removing the first oxide layer and the doped polysilicon layer in the first region to expose the substrate of the first region;

forming a second oxide layer on the substrate in the first region;

oxidizing the doped polysilicon layer to a poly-oxide layer; and removing the poly-oxide layer to expose the first oxide layer, wherein the first oxide layer is thicker than the second oxide layer.

2. The fabrication method for a semiconductor device comprising various thicknesses of oxide layers according to claim 1, wherein photolithography and etching are further conducted to remove the doped polysilicon layer and the first oxide layer in the first region.

3. The fabrication method for a semiconductor device comprising various thicknesses of oxide layers according to claim 1, wherein the formation of the second oxide layer includes conducting a thermal process.

4. The fabrication method for a semiconductor device comprising various thicknesses of oxide layers according to claim 3, wherein the formation of the poly-oxide layer from the doped polysilicon layer occurs concurrently with the thermal process.

5. The fabrication method for a semiconductor device comprising various thicknesses of oxide layers according to claim 1, wherein the poly-oxide layer is removed by wet etching.

6. The fabrication method for a semiconductor device comprising various thicknesses of oxide layers according to claim 1, wherein the step of wet etching includes using an etchant with a sufficiently high etching selectivity ratio to remove the poly-oxide layer without removing the first oxide layer or the second oxide layer.

* * * * *